United States Patent
Kang et al.

(10) Patent No.: US 10,062,899 B2
(45) Date of Patent: Aug. 28, 2018

(54) METHOD FOR PREPARING GRAPHITE-TITANIUM OXIDE COMPOSITE

(71) Applicant: Dongguk University Industry-Academic Cooperation Foundation, Seoul (KR)

(72) Inventors: Yong-mook Kang, Seoul (KR); Mi-ru Jo, Seoul (KR); Da-hye Song, Incheon (KR); Gi-hyeok Lee, Cheonan-si (KR)

( * ) Notice: Subject to any disclaimer, the term of this patent is extended or adjusted under 35 U.S.C. 154(b) by 80 days.

(21) Appl. No.: 15/034,046

(22) PCT Filed: Aug. 18, 2014

(86) PCT No.: PCT/KR2014/007617
§ 371 (c)(1),
(2) Date: May 3, 2016

(87) PCT Pub. No.: WO2015/026110
PCT Pub. Date: Feb. 26, 2015

(65) Prior Publication Data
US 2017/0271650 A1 Sep. 21, 2017

(30) Foreign Application Priority Data

Aug. 19, 2013 (KR) .................. 10-2013-0097830
Aug. 14, 2014 (KR) .................. 10-2014-0105975

(51) Int. Cl.
| | | |
|---|---|---|
| C30B 29/16 | (2006.01) | |
| H01M 4/04 | (2006.01) | |
| C01B 31/04 | (2006.01) | |
| C01G 23/053 | (2006.01) | |
| C30B 1/02 | (2006.01) | |

(Continued)

(52) U.S. Cl.
CPC ............ *H01M 4/0471* (2013.01); *C01B 31/04* (2013.01); *C01G 23/053* (2013.01); *C30B 1/02* (2013.01); *C30B 1/10* (2013.01); *C30B 29/16* (2013.01); *H01M 4/366* (2013.01); *H01M 4/48* (2013.01); *H01M 4/583* (2013.01);
(Continued)

(58) Field of Classification Search
CPC ......... C01B 31/04; H01M 4/48; H01M 4/583; C30B 29/16
See application file for complete search history.

(56) References Cited

FOREIGN PATENT DOCUMENTS

| | | |
|---|---|---|
| CN | 1125857 | * 10/2003 |
| KR | 10-1999-0044404 | 5/2001 |

(Continued)

OTHER PUBLICATIONS

English Abstract of, 10-1999-0044404.
(Continued)

*Primary Examiner* — Robert M Kunemund
(74) *Attorney, Agent, or Firm* — Antonio Ha & U.S. Patent, LLC

(57) ABSTRACT

According to an embodiment of the present invention, a method for preparing a graphite-titanium oxide composite comprises (S1) a surface-modifying graphite with benzyl alcohol or a cellulose-based material using a sol-gel method, (S2) distributing the surface-modified graphite in a solvent, adding a titanium precursor to the solvent, and mixing the titanium precursor with the surface-modified graphite to obtain a graphite-titanium mixture, and (S3) thermally treating the graphite-titanium mixture to grow a titanium oxide on a surface of the graphite.

11 Claims, 8 Drawing Sheets

(51) Int. Cl.
*C30B 1/10* (2006.01)
*H01M 4/36* (2006.01)
*H01M 4/48* (2010.01)
*H01M 4/583* (2010.01)
*H01M 4/02* (2006.01)

(52) U.S. Cl.
CPC ...... *C01P 2004/80* (2013.01); *C01P 2006/40* (2013.01); *H01M 2004/027* (2013.01)

(56) References Cited

FOREIGN PATENT DOCUMENTS

| KR | 10-2007-0040853 | 10/2008 |
|----|-----------------|---------|
| KR | 10-2011-0001951 | 1/2011  |
| KR | 10-2011-0049629 | 5/2011  |
| KR | 10-2012-0045411 | 5/2012  |
| KR | 10-2013-0016022 | 2/2013  |

OTHER PUBLICATIONS

English Abstract of, 10-2007-0040853.
Meng-Lun Lee Et Al, Applied Surface Science 258 (2012)5938-42.
English Abstract of, 10-2012-0045411.
English Abstract of, 10-2013-0016022.
English Abstract of, 10-2011-0049629.
English Abstract of, 10-2011-0001951.

\* cited by examiner

[Fig. 1]
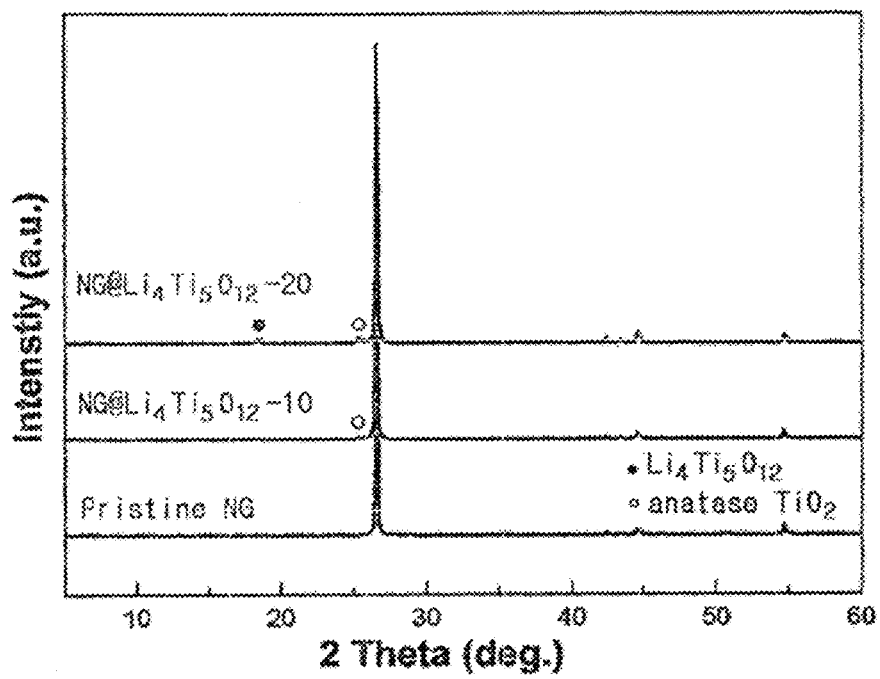
[Fig. 2]
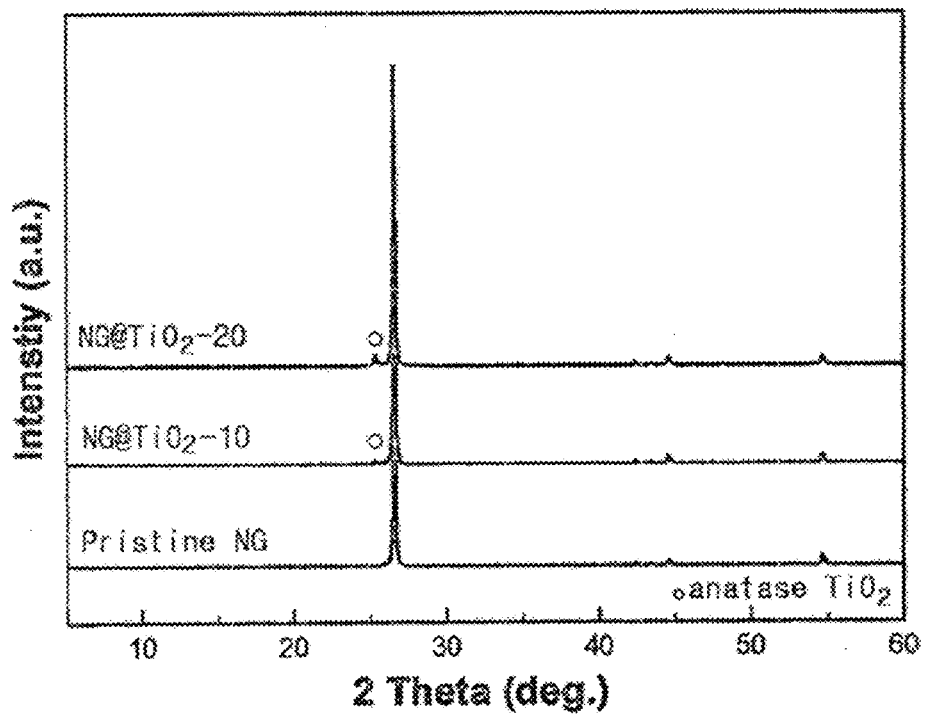

[Fig. 3]
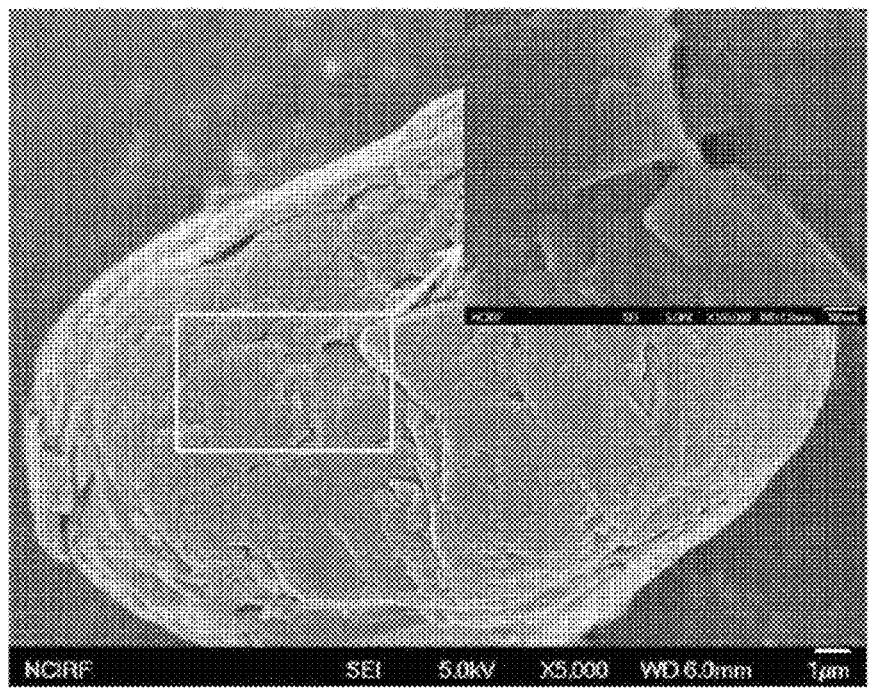
[Fig. 4]
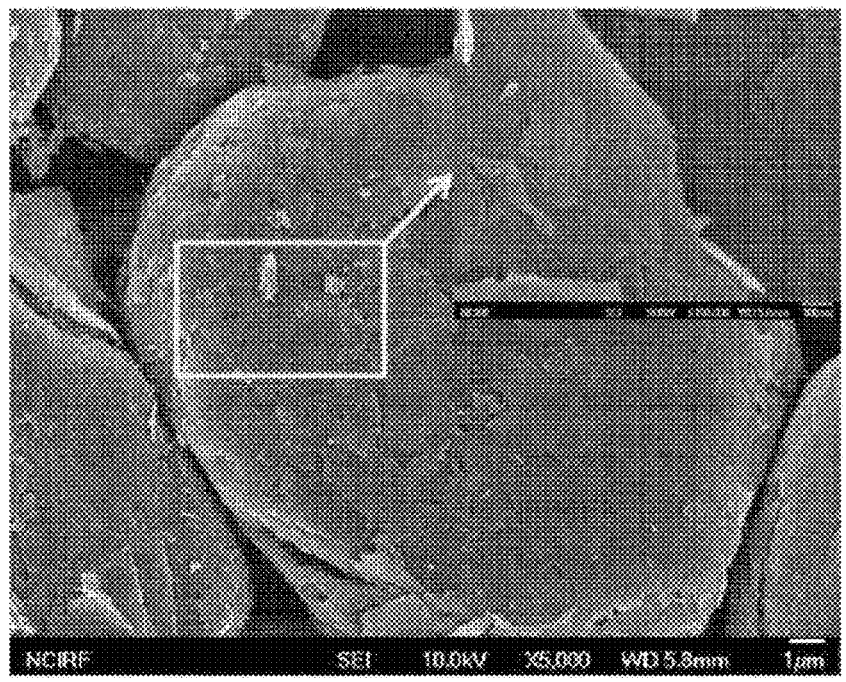

[Fig. 5]
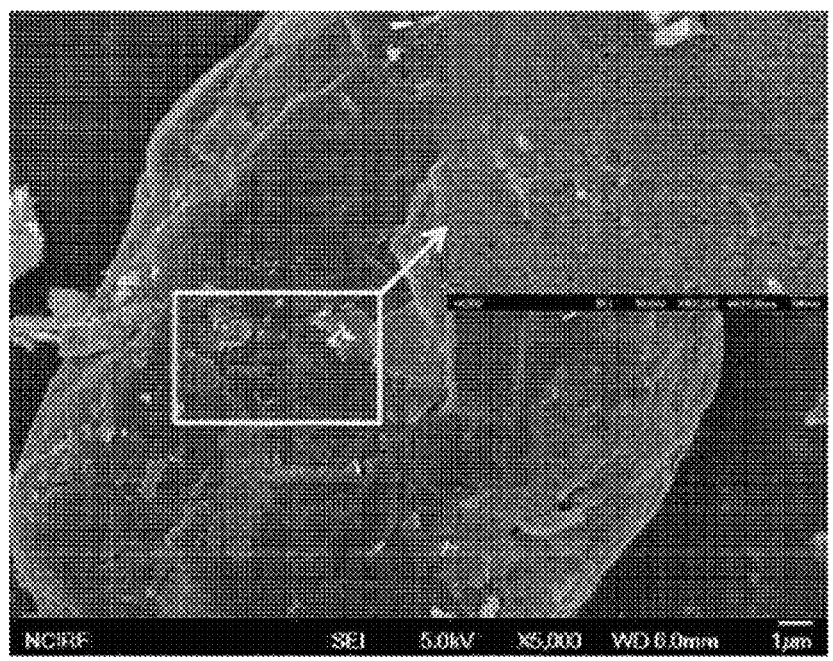
[Fig. 6]
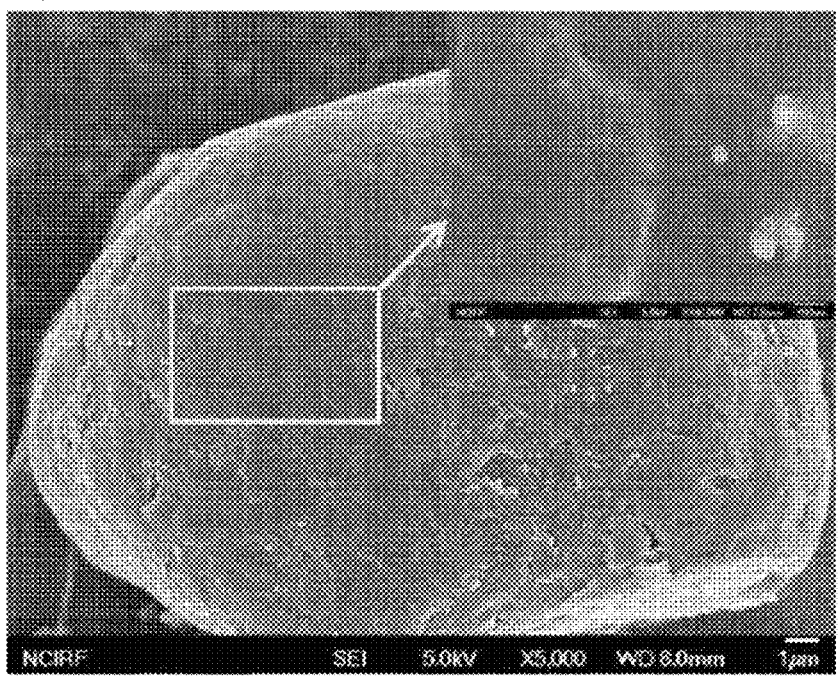

[Fig. 7]
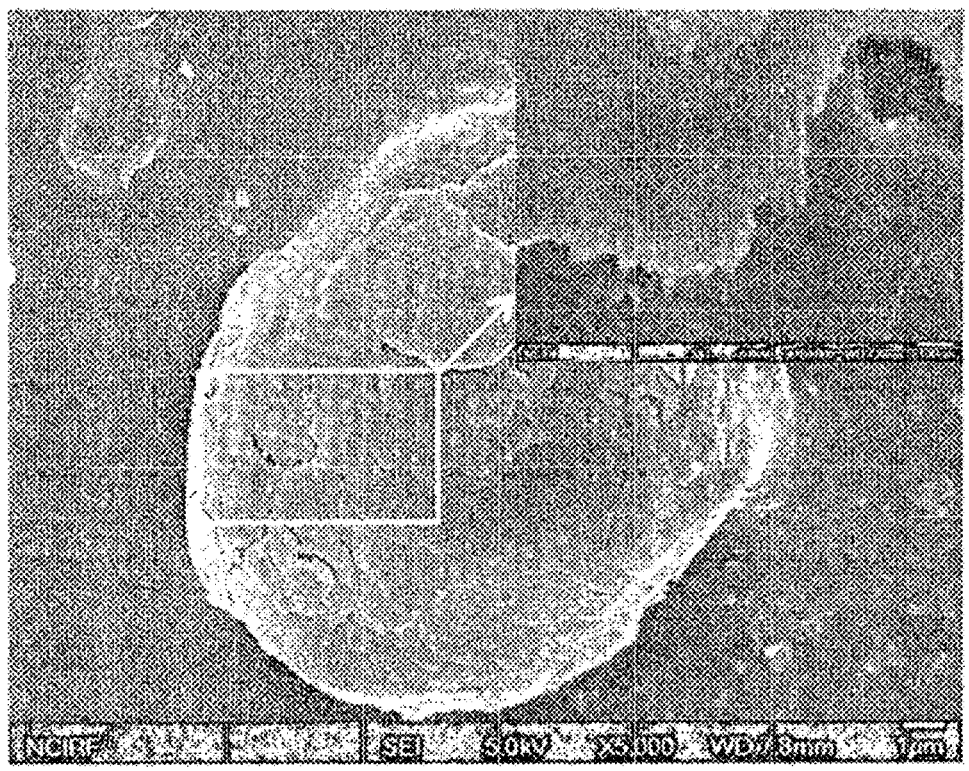
[Fig. 8]
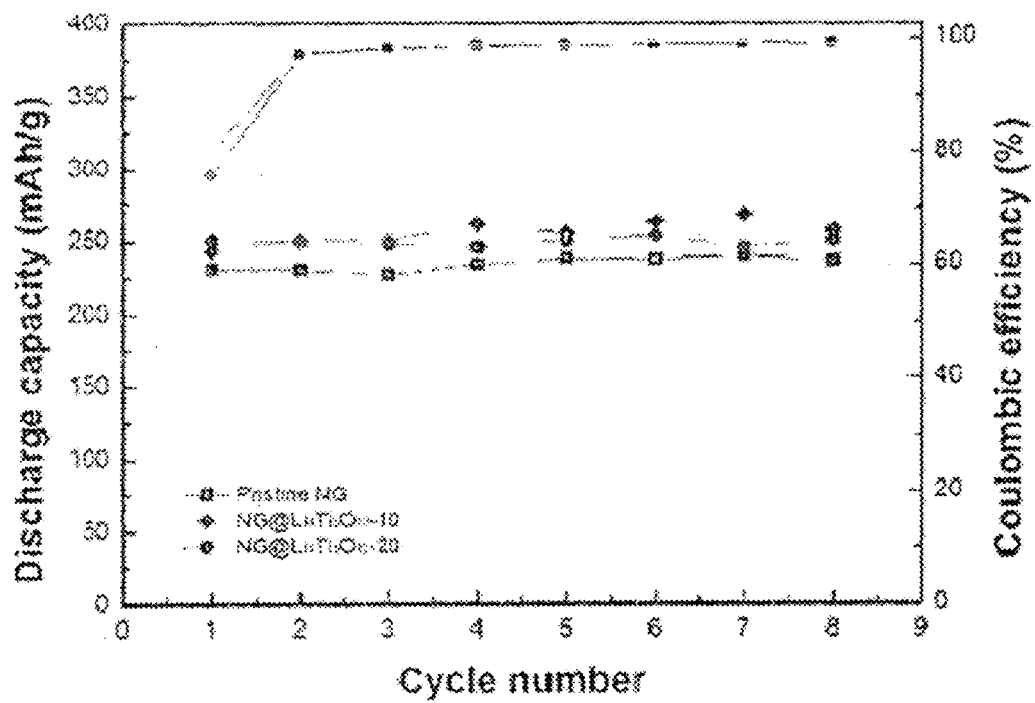

[Fig. 9]
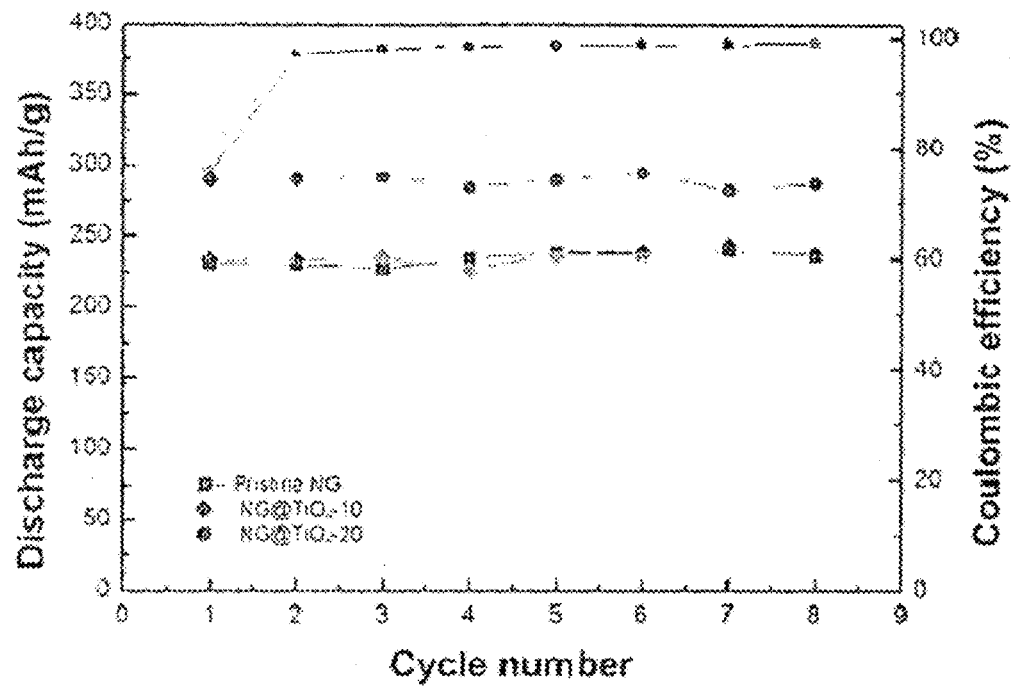
[Fig. 10]
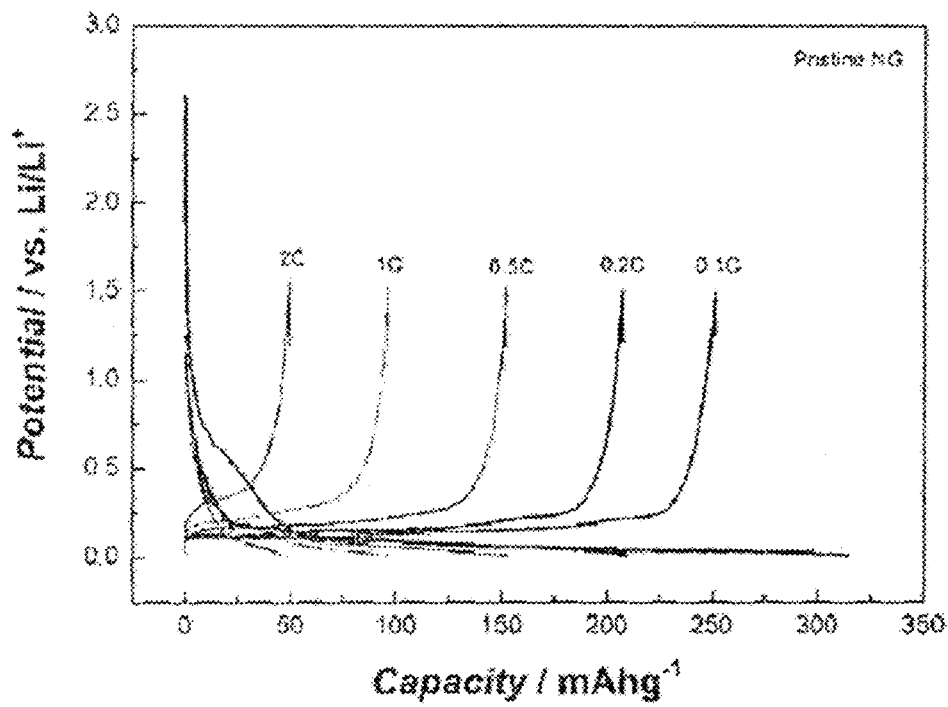

[Fig. 11]
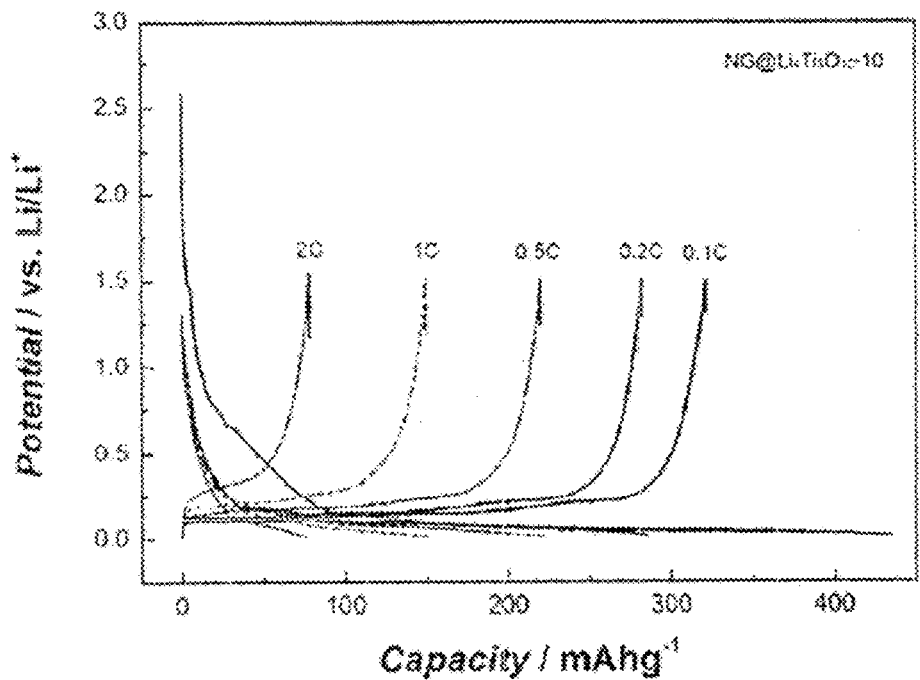
[Fig. 12]
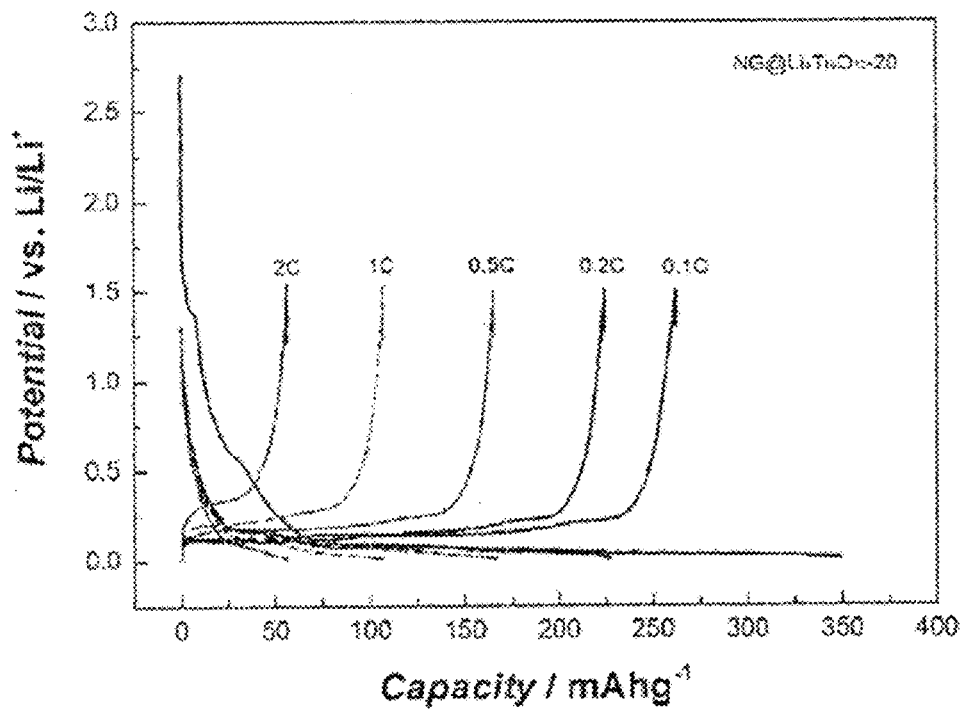

[Fig. 13]
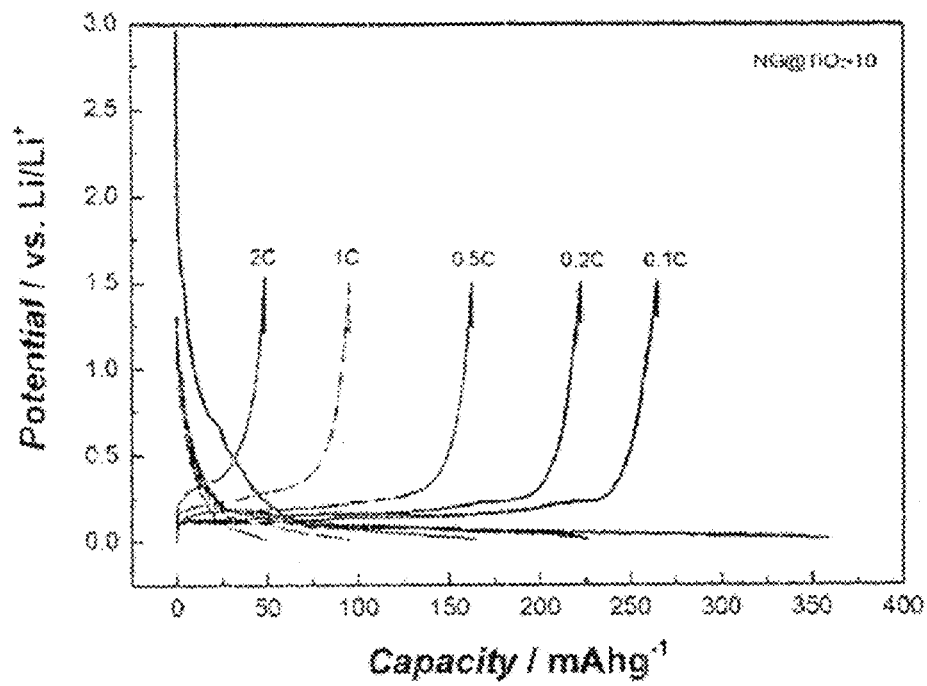
[Fig. 14]
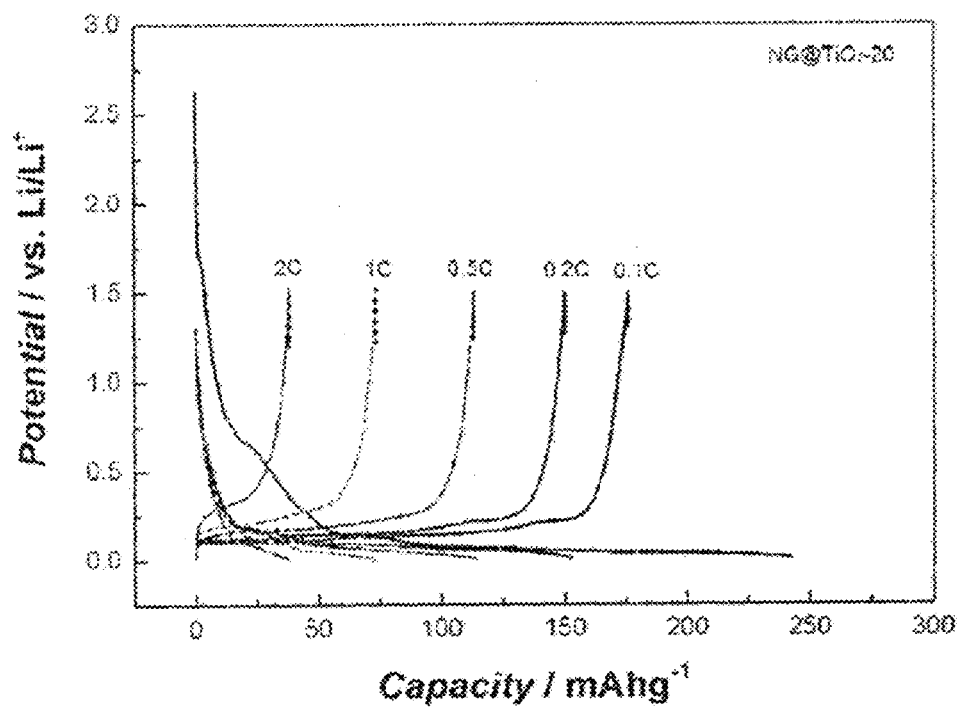

[Fig. 15]
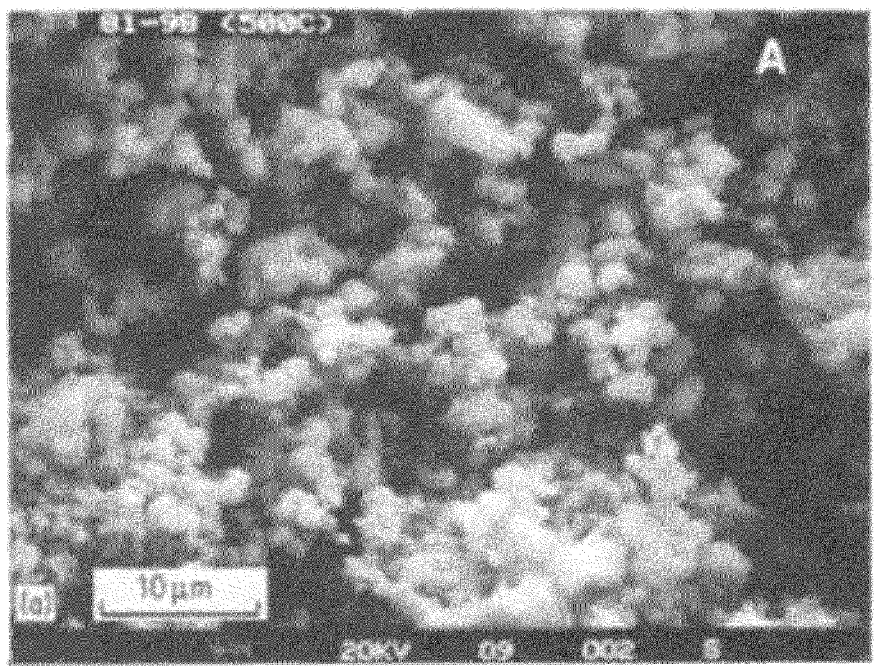
[Fig. 16]
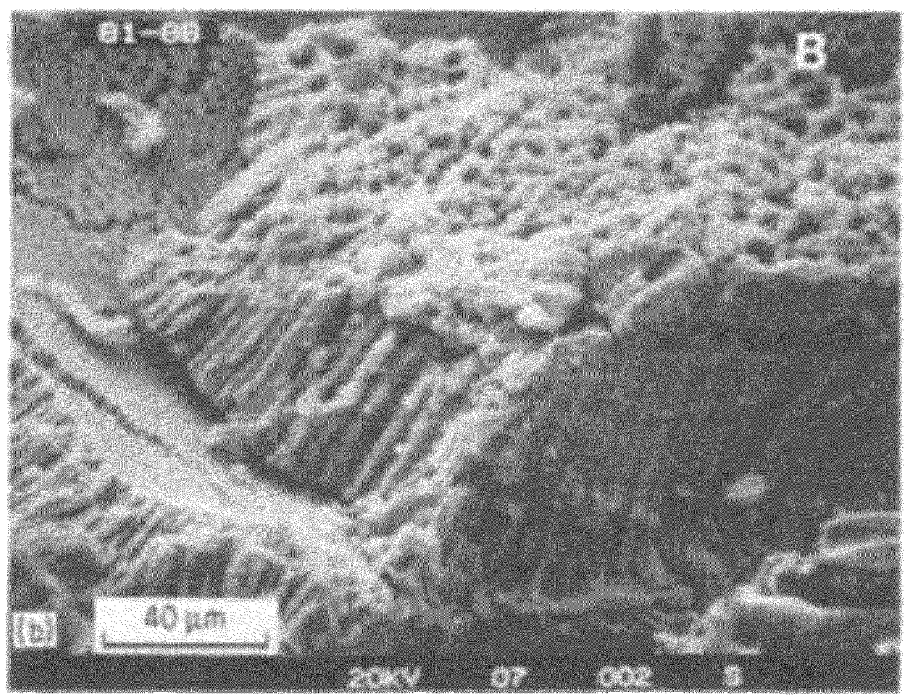

METHOD FOR PREPARING GRAPHITE-TITANIUM OXIDE COMPOSITE

CROSS-REFERENCE TO RELATED APPLICATIONS

This patent application is a national stage application of International Patent Application No. PCT/KR2014/007617 filed on Aug. 18, 2014, which claims priority under 35 U.S.C. § 119 to Korean Patent Applications Nos. 10-2013-0097830 and 10-2014-0105975, respectively filed on Aug. 19, 2013 and Aug. 14, 2014, in the Korean Intellectual Property Office, the disclosures of which are incorporated by reference herein in their entireties.

TECHNICAL FIELD

The present invention relates to a method for preparing a graphite-titanium oxide composite, and more specifically, to a method for preparing a graphite-titanium oxide composite, which may enhance charging-discharging properties and rate performance with a simplified process.

DISCUSSION OF RELATED ART

Secondary cells or batteries have been used to date for portable electronics or hybrid vehicles (HEV) and are expected to be further used in energy storage devices for power generating systems.

However, use for such large-size devices requires higher energy density, output density, and stability, and to meet such demand, various research efforts are underway.

Carbon-based active materials, as existing anion active materials for secondary batteries, suffer from high initial irreversible capacity and low thermal stability despite, reasonable costs and good lifespan characteristics and are thus required to be enhanced.

An enhancement in the thermal stability of carbon-based active materials may be achieved by coating a metal oxide, e.g., aluminum oxide or zirconium oxide, on the surface of graphite.

Among others, a titanium oxide is a material that does not create stress when lithium is inserted or removed and is considered to have very good structural/thermal stability during charging and discharging.

Thus, the inventors attempt to enhance the electrochemical lifespan and ratio performance as well as thermal/structural stability by evenly coating a titanium oxide on the surface of graphite for a better enhancement in the thermoelectric characteristics of graphite.

PRIOR DOCUMENTS

Patent Documents (Patent Document 1) Korean Patent Application Publication No. 10-1999-0044404

(Patent Document 2) Korean Patent Application Publication No. 10-2007-0040853

SUMMARY

To address the problems of the prior art, the present invention aims to provide a method for preparing a graphite-titanium oxide composite with enhanced thermal/structural stability and electrochemical lifespan and ratio performance over graphite by evenly coating a titanium oxide on the graphite The present invention also aims to provide a graphite-titanium oxide composite prepared by the above method, an anion active material of a lithium secondary cell including the same, and a lithium secondary cell including the same.

To achieve the above objects, the present invention provides a method for preparing a graphite-titanium oxide composite, the method comprising the steps of (S1) a surface-modifying graphite with benzyl alcohol or a cellulose-based material using a sol-gel method; (S2) distributing the surface-modified graphite in a solvent, adding a titanium precursor to the solvent, and mixing the titanium precursor with the surface-modified graphite to obtain a graphite-titanium mixture; and (S3) thermally treating the graphite-titanium mixture to grow a titanium oxide on a surface of the graphite.

As the solvent, a mixture of ethanol and distilled water or a Mixture of ethanol and peroxide may be used.

$N_4OH$ or $HNO_3$ may be added to the distilled water.

In the mixture of the ethanol and the distilled water, a weight ratio of the ethanol to the distilled water is preferably 5:1 to 100:1.

In the mixture of the ethanol and the peroxide, a weight ratio of the ethanol and the peroxide is preferably 5:1 to 100:1.

In step S2, 5 parts by weight to 40 parts by weight of the titanium precursor are preferably added relative to 100 parts by weight of the graphite.

As the titanium precursor, titanium butoxide or titanium isopropoxide may be used.

The thermal treatment is preferably performed in an atmosphere of argon (Ar) at 600° C. to 800° C., for two hours to five hours.

The method may further comprise, after step S2 mixing the mixture obtained in step S2 with a lithium precursor and performing hydrothermal synthesis.

The hydrothermal synthesis is preferably performed at 80° C. to 180° C., for 1 hours to 12 hours.

10 parts by weight to 80 parts by weight of the lithium precursor are preferably added relative to 100 parts by weight of the graphite.

As the lithium precursor, lithium hydroxide, lithium acetate dehydrate, and lithium nitrate may be used.

The present invention also provides a graphite-titanium oxide composite prepared by the method.

The present invention also provides an anion active material of a secondary cell including the graphite-titanium oxide composite.

The present invention also provides a secondary cell including the anion active material.

By the method for preparing a graphite-titanium oxide composite according to the present invention, a titanium oxide may be evenly coated on the surface of graphite, stabilizing the formation of a solid electrolyte interphase (SEI) film due to electrolyte decomposition to delay the disintegration of the graphite structure, and thus securing stabilized charging/discharging characteristics and good lifespan characteristics.

Further, insertion of polar solvent molecules of electrolyte except lithium ions on the surface of graphite may be reduced, leading to an enhanced ratio performance.

Further, a graphite-titanium oxide composite may be prepared by a simplified process, which is predicted to be commercially available in an easier manner.

BRIEF DESCRIPTION OF THE DRAWINGS

FIG. 1 is an X-ray diffraction analysis graph of a graphite-lithium titanium oxide composite according to Embodiment 1 and graphite;

FIG. 2 is an X-ray diffraction analysis graph of a graphite-titanium oxide composite according to Embodiment 2 and graphite;

FIG. 3 is an SEM picture for graphite;

FIG. 4 is an SEM picture for a graphite-lithium titanium oxide composite (10% of titanium precursor);

FIG. 5 is an SEM picture for a teraphite-lithium titanium oxide composite (20% of titanium precursor);

FIG. 6 is an SEM picture of a graphite-titanium oxide composite (10% of titanium precursor);

FIG. 7 is an SEM picture of a graphite-titanium oxide composite (20% of titanium precursor);

FIG. 8 is a graph illustrating discharging capacity and efficiency of a graphite-lithium titanium oxide composite according to Embodiment 1 and graphite;

FIG. 9 is a graph illustrating discharging capacity and efficiency of a graphite-titanium oxide composite according to Embodiment 2 and graphite;

FIG. 10 is a graph illustrating a result of measuring a charging/discharging ratio performance of graphite;

FIG. 11 is a graph illustrating a result of measuring a charging/discharging ratio performance of a graphite-lithium titanium oxide composite (10% of titanium precursor);

FIG. 12 is a graph illustrating a result of measuring a charging/discharging ratio performance of a graphite-lithium titanium oxide composite (20% of titanium precursor);

FIG. 13 is a graph illustrating a result of measuring a charging/discharging ratio performance of a graphite-titanium oxide composite (10% of titanium precursor);

FIG. 14 is a graph illustrating a result of measuring a charging/discharging ratio performance of a graphite-titanium oxide composite (20% of titanium precursor);

FIG. 15 is a picture of $TiO_2$ obtained by adding $HNO_3$ to distilled water to perform hydrolysis at a reduced pH; and FIG. 16 is a picture of $TiO_2$ obtained by adding $NH_4OH$ to distilled water to perform hydrolysis at a reduced pH;

DETAILED DESCRIPTION OF EMBODIMENTS

Hereinafter, the present invention is described in detail. Relevant known configurations or functions may be excluded from the description of the present invention.

The terms or words used in the specification and the claims should not be interpreted to have typical or dictionary meanings, and rather, to comply with technical matters of the present invention.

The embodiments set forth in the specification and the configurations shown in the drawings are merely preferred embodiments but do not represent all of the technical spirits of the present invention, and thus, various modifications or equivalents may be made which may replace the embodiments as of the time of filing the instant application.

An embodiment of the present invention relates to a method for preparing a graphite-titanium oxide composite by distributing, e.g., a titanium precursor on the graphite through a sol-gel method and a hydrothermal method and then evenly coating a titanium oxide through a thermal treatment to prepare a graphite-titanium oxide composite.

According to an embodiment of the present invention, a method for preparing a graphite-titanium oxide composite includes a step S1 in which benzyl alcohol of a cellulose-based material is dispersed in graphite and is filtered to modify the surface of the graphite with the benzyl alcohol or cellulose-based material, a step S2 in which the graphite surface-modified with the benzyl alcohol or cellulose-based material is distributed in a solvent and is added with a titanium precursor and mixed with the titanium precursor, and a step S3 in which the mixture obtained in step S2 is thermally treated to grow a titanium oxide on the surface of graphite.

Hereinafter, a method for preparing a graphite-titanium oxide composite is described below in detail on a step-by-step basis.

First, graphite is dispersed in a hydrophilic surfactant, e.g., benzyl alcohol or a cellulose-based material and filtered to surface-modify the graphite with the benzyl alcohol or cellulose-based material (S1).

The benzyl alcohol and cellulose-based material modifies the surface of graphite to have hydrophilicity so as to lead to better nucleation of titanium oxide on the surface of graphite which is hydrophobic. Accordingly, the titanium oxide may be evenly coated on the surface of graphite.

Here, the benzyl alcohol has a benzyl ring structure with an SP2 hybrid structure. This structure is planar and thus allows for bonding with the base surface of graphite by a Van der Waals force. The —OH group positioned at an opposite side of the benzyl ring may form a covalent bond with Ti.

For example, upon dispersing the graphite in the benzyl alcohol or cellulose-based material, the graphite may be added in a ratio of one part by weight to 10 parts by weight relative to 100 parts by weight of the benzyl alcohol or cellulose-based material. However embodiments of the present invention are not limited thereto.

When the amount of the graphite exceeds the upper limit of the range, poor dispersion may be achieved, rendering it difficult to obtain even surface modification, and when the amount of the graphite is less than the lower limit of the range, the relatively too much benzyl alcohol and cellulose-based material may result in uneven surface modification.

The graphite surface-modified with the benzyl alcohol or cellulose-based material is dispersed in a solvent and is mixed with a titanium precursor (S2).

As the solvent, a mixture of ethanol and distilled water or a mixture of ethanol and peroxide may be used.

The weight ratio of ethanol to distilled water in the mixture of ethanol and distilled water may be in a range from 5:1 to 100:1, but is not limited thereto.

When the amount of ethanol in the mixture of ethanol and distilled water exceeds the upper limit of the range, the hydrolysis of titanium may take longer or may be incompletely performed. When the amount of ethanol in the mixture of ethanol and distilled water is less than the lower limit of the range, the hydrolysis of titanium may occur too fast to achieve even coating.

For example, the weight ratio of ethanol to peroxide may be in a range from 5:1 to 100:1, but is not limited thereto.

When the amount of ethanol in the mixture of ethanol and peroxide exceeds the upper limit of the range, the hydrolysis of titanium may take lone or may be incompletely performed. When the amount of ethanol in the mixture of ethanol and peroxide is less than the lower limit of the range, the hydrolysis of titanium may occur too fast to achieve even coating.

$NH_4OH$ or $HNO_3$ may be added to the distilled water to control the pH of the reactant to allow for easier control of the formation and thickness of a $TiO_2$ coat on the surface of graphite (refer to FIGS. 15 and 16)

For example, the amount of titanium precursor added in step S2 may be 5 parts by weight to 40 parts by weight relative to 100 parts by weight of the graphite, but is not limited thereto.

When the amount of the titanium precursor added exceeds the upper limit of the range, there may be remaining titanium not participating in the coating on the surface of graphite, and when the amount of the titanium precursor is less than the lower limit of the range, the surface of the graphite particles may be partially left uncoated.

As the titanium precursor, e.g., titanium butoxide or titanium isopropoxide, alone or in a mixture thereof, may be used.

The mixture obtained in step S2 is thermally treated, allowing titanium oxide to grow on the surface of graphite (S3).

For example, the thermal treatment may be preferably performed in an Ar atmosphere at 600° C., to 800° C. for two to five hours, but is not limited thereto.

When the temperature of the thermal treatment exceeds the upper limit of the range, particle clumping may occur, and when the temperature of the thermal treatment is less than the lower limit of the range, the titanium oxide may exhibit reduced crystallizability.

When the time of the thermal treatment exceeds the upper limit of the range, particle clumping may occur, and when the time of the thermal treatment is less than the lower limit of the range, the titanium oxide may exhibit reduced crystallizability.

The above process may present a graphite-titanium oxide composite having the titanium oxide uniformly coated on the surface of graphite.

By the method for preparing a graphite-titanium oxide composite according to an embodiment of the present invention, the titanium oxide may be evenly or homogeneously coated on the surface of graphite, and thus, a solid electrolyte interphase (SEI) film may be stably formed by decomposition of the electrolyte that occurs upon charging or discharging, thereby delaying the disintegration of the structure of graphite.

Thus, a stable charging/discharging property may be secured, which leads to a lifespan property.

Further, insertion of polar solvent molecules of electrolyte except for lithium ions onto the surface of graphite may be reduced, allowing for an enhanced rate performance.

According to am embodiment of the present in the method for preparing a graphite-titanium oxide composite may further include, after step S2, mixing the mixture obtained in step S2 with a lithium precursor and performing hydrothermal synthesis.

The mixture of the lithium precursor and hydrothermal synthesis may lead the prepared graphite-lithium titanium oxide composite to a further enhanced electrochemical lifespan and rate performance.

The hydrothermal synthesis may be performed in a temperature range from 80° C. to 180° C. for in a time range from 10 hours to 12 hours.

When the temperature of the hydrothermal synthesis exceeds the upper limit of the temperature range, the titanium may be separated from the graphite, and when the temperature of the hydrothermal synthesis is less than the lower limit of the temperature range, the lithium precursor might not bond with the titanium.

When the time of the hydrothermal synthesis exceeds the upper limit of the time range, particle deformation may occur, and when the time of the hydrothermal synthesis is less than the lower limit of the time range, the lithium precursor may fail to bond with the titanium.

The amount of the added lithium precursor may be 10 parts by weight to 80 parts by weight relative to 100 parts of weight of graphite, but is not limited thereto.

When the amount of the added lithium precursor exceeds the upper limit of the range, a phase with too much lithium may occur, and when the amount of the added lithium precursor is less than the lower limit of the range, two phases, e.g., a lithium titanium oxide and a titanium oxide, may occur, rendering it difficult to obtain a single phase of lithium titanium oxide.

As the lithium precursor, e.g., lithium hydroxide, lithium acetate dehydrate, and lithium nitrate may be used alone or in a mixture thereof.

Although preferred embodiments are presented for a better understanding of the present invention, the following embodiments are merely provided to exemplify the present invention, and it is apparent to one of ordinary skill in the art that various changes or modifications may be made thereto without departing from the category or technical spirit of the present invention and such changes and modifications belong to the scope of the claims.

Embodiment 1: Preparation of Graphite-Lithium Titanium Oxide ($Li_4Ti_5O_{12}$) Composite First, graphite was distributed in benzyl alcohol and was filtered to obtain surface-treated graphite. Then, the sufficetreated graphite gas put in ethanol and distilled water to be evenly distributed, added with a titanium precursor, stirred to hydrolysis allowing the titanium precursor to be evenly coated on the surface of graphite, and was then filtered and dried.

Thereafter, the prepared graphite-titanium oxide powder and a lithium hydroxide monohydrate solution were put in a Teflon container and were subjected to hydrothermal synthesis at 80° C. for 10 hours.

The mixture prepared through the hydrothermal synthesis were subjected to thermal treatment in an atmosphere of argon (Ar) at 600° C. for two hours, forming a graphite-lithium titanium oxide ($Li_4Ti_5O_{12}$) composite.

Embodiment 2: Preparation of Graphite Titanium Oxide ($TiO_2$) Composite

A graphite titanium oxide ($TiO_2$) composite was prepared by a method similar to the method according to Embodiment 1, which does not include adding the lithium precursor and performing hydrothermal synthesis.

For example, graphite was distributed in benzyl, alcohol and was filtered to obtain surface-treated graphite. Then, the surface-treated graphite was put in ethanol and distilled water to be evenly distributed, added with a titanium precursor, stirred to hydrolysis allowing the titanium precursor to be evenly coated on the surface of graphite, and was then filtered and dried. The mixture was subjected to thermal treatment in an atmosphere of argon (Ar) at −600° C. for two hours, forming a graphite titanium oxide ($TiO_2$) composite.

Experimental Example: X-ray Diffraction Analysis

To analyze the structure of the graphite-titanium oxide composite prepared according to Embodiment 1 and the graphite-lithium titanium oxide composite prepared according to Embodiment 2, an X-ray diffraction analysis was carried out on the composites and a comparison group, which is graphite particles, and results were shown in FIGS. 1 and 2.

As evident from FIGS. 1 and 2, a peak was shown which is peculiar to graphite. The graphite-(lithium) titanium oxide composites according to an embodiment of the present invention exhibited a distinctive peak at an angle of 2θ as graphite did. As the ratio of titanium precursor relative to graphite increased, peaks corresponding to $Li_4Ti_5O_{12}$ and $TiO_2$ were shown.

From the above results, the graphite-(lithium) titanium oxide composites according to an embodiment of the present invention may be verified to have substantially the same crystalline structure as graphite.

Experimental Example: Scanning Electron Microscope (SEM) Analysis

To analyze images of the graphite-(lithium) titanium oxide composites prepared according to Embodiments 1 and 2, an SEM analysis was conducted and results were shown in FIGS. 3 to 7.

As evident from FIGS. 3 to 7, (lithium) titanium oxide was evenly or homogeneously coated on the surface of graphite, and it was verified that as the ratio of the precursor increased, nucleation of (lithium) titanium oxide on the surface was developed, which was consistent with the result obtained by the X-ray diffraction analysis.

Comparison Example: Charging/Discharging Curve and Coulomb Efficiency Analysis

A graphite-(lithium) titanium oxide composite prepared according to Embodiment 1 or 2 was used as an anode active material to produce a half cell. Charging and discharging were perforated on the half cell at C/10, 0.01V to 1.5V, and results of measuring charging/discharging characteristics were shown in FIGS. 8 and 9. Further, charging and discharging were performed on the half cell at 0.01V to 3V and C/10, C/5, C/2, 1C, and 2C, and results of measuring charging/discharging characteristic's were shown in FIGS. 10 to 14. As evident from FIGS. 8 and 9, the graphite presented a low capacity close to 230 mAh/g upon first charging while the graphite-(lithium) titanium oxide composite prepared according to Embodiment 1 or 2 exhibited a capacity higher than the graphite upon first charging and maintained its capacity as charging and discharging repeatedly go on.

As evident from FIGS. 10 to 14, the graphite presented a significantly reduced capacity as the charging/discharging speed increased from C/10 to 2C whereas the graphite-lithium) titanium oxide composite according to an embodiment of the present invention exhibited a reduced lowering in capacity as the charging/discharging speed increases as compared with the graphite.

In light of the foregoing results, the graphite-(lithium) titanium oxide composite according to an embodiment of the present invention exhibited an enhanced electrochemical property thanks to the SEI film stably formed as compared with the graphite which is the comparison group.

What is claimed is:

1. A method for preparing a graphite-titanium oxide composite, the method comprising the steps of:
   (S1) a surface-modifying graphite with benzyl alcohol or a cellulose-based material using a sol-gel method;
   (S2) distributing the surface-modified graphite in a solvent, adding a titanium precursor to the solvent, and mixing the titanium precursor with the surface-modified graphite to obtain a graphite-titanium mixture; and
   (S3) thermally treating the graphite-titanium mixture to grow a titanium oxide on a surface of the graphite, wherein the titanium precursor is titanium butoxide or titanium isopropoxide.

2. The method of claim 1, wherein the solvent is a mixture of ethanol and distilled water or a mixture of ethanol and peroxide.

3. The method of claim 2, wherein NH4OH or HNO3 is added to the distilled water.

4. The method of claim 2, wherein in the mixture of the ethanol and the distilled water, a weight ratio of the ethanol to the distilled water is 5:1 to 100:1.

5. The method of claim 2, wherein in the mixture of the ethanol and the peroxide, a weight ratio of the ethanol and the peroxide is 5:1 to 100:1.

6. The method of claim 1, wherein, in step S2, 5 parts by weight to 40 parts by weight of the titanium precursor are added relative to 100 parts by weight of the graphite.

7. The method of claim 1, wherein the thermal treatment is performed in an atmosphere of argon (Ar) at 600° C. to 800° C. for two hours to five hours.

8. The method of claim 1, further comprising, after step S2, mixing the mixture obtained in step S2 with a lithium precursor and performing hydrothermal synthesis.

9. The method of claim 8, wherein the hydrothermal synthesis is performed at 80° C. to 180° C. for 10 hours to 12 hours.

10. The method of claim 8, wherein 10 parts by weight to 80 parts by weight of the lithium precursor are added relative to 100 parts by weight of the graphite.

11. The method of claim 8, wherein the lithium precursor is any one selected from the group consisting of lithium hydroxide, lithium acetate dehydrate, and lithium nitrate.

* * * * *